United States Patent [19]

Hagiwara et al.

[11] Patent Number: 5,424,989
[45] Date of Patent: Jun. 13, 1995

[54] SEMICONDUCTOR MEMORY DEVICE

[75] Inventors: Norio Hagiwara, Omiya, Japan; Kazuhisa Sakihama, Mountain View, Calif.

[73] Assignee: Kabushiki Kaisha Toshiba, Kawasaki, Japan

[21] Appl. No.: 109,488

[22] Filed: Aug. 20, 1993

[30] Foreign Application Priority Data

Aug. 21, 1992 [JP] Japan .................. 4-222826

[51] Int. Cl.⁶ ............................................ G11C 13/00
[52] U.S. Cl. ........................... 365/201; 365/200; 371/10.1
[58] Field of Search ............... 365/200, 201; 371/10.1, 371/10.2

[56] References Cited

U.S. PATENT DOCUMENTS 4,389,715 6/1983 Eaton et al. ................... 365/200
4,727,516 2/1988 Yoshida et al. ................. 365/200
5,199,033 3/1993 McGeoch et al. ............. 365/200

Primary Examiner—Terrell W. Fears
Attorney, Agent, or Firm—Foley & Lardner

[57] ABSTRACT

A semiconductor memory device having information data storing cells and error correction data storing memory cells. When information data is inputted, error correction data related to the information data is formed. In a usual use, the information data and the error correction data are stored in the corresponding memory cells. An external test signal, inputted as the information data, can be stored in the error correction data storing memory cells by a write control signal. In a usual use, the information data stored in the information data storing cells are outputted, as they are or corrected if erroneous. The test signal stored in the error correction data storing memory can be outputted by an output control signal.

10 Claims, 4 Drawing Sheets

SEMICONDUCTOR MEMORY DEVICE

BACKGROUND OF THE INVENTION

1. Field of the Invention

The present invention relates to a semiconductor memory device provided with error correcting function.

2. Description of the Prior Art

In the semiconductor memory device in general, when information data are written in the memory cell array, error correction data (parity data) are stored additionally. That is, when the information data are read from the memory cell array, inspection as to whether the data contents are correct or not (parity check) is effected. When an error is found, the read data are outputted after having been corrected.

The semiconductor memory device in general is provided with an error correction data forming circuit and an error inspecting and correcting circuit.

For example, on the basis of the information data of 8 bits, the error correction data forming circuit forms error correction data of 4 bits. The error correction data forming circuit accepts predetermined data of at least one bit (previously determined according to the system) from the 8-bit information data, and processes the accepted data in accordance with a predetermined calculation to form a bit value. Thus, the information data of 8 bits and the error correction data of 4 bits, the total of 12 bits, are stored in the memory cell array.

The error inspecting correcting circuit processes the received 12-bit data in accordance with a predetermined calculation to inspect whether an error of the 8-bit information data is present or absent and further to find the error bit, if any. In the case of the absence of error, the received information data are outputted to an input/output buffer as they are (as path-through data). In the case of the presence of an error bit, the error bit is inverted and then outputted to the input/output buffer.

As described above, the error correcting function can provide a system resistant against noise, without interrupting the information calculation processing in such a case where one bit of the 8-bit information data is not transmitted correctly.

On the other hand, the semiconductor memory circuit device must be tested for operation and evaluated for the performance before shipment, in order to secure the reliability of the products using the semiconductor memory device.

In the conventional semiconductor device, however, there exists a problem when tested in accordance with a certain test method.

For instance, there exists such a test method that the operation test is evaluated by first storing a 12-bit alternate test data pattern such as "0101 ... 0101" in the memory cell array and then by reading these stored 12-bit data, as one method of testing the semiconductor memory device.

In the above-mentioned semiconductor memory device, however, since the correction data stored in an error correction data storing area of the memory cell array are perfectly dependent upon the information data, the above-mentioned alternate pattern cannot be stored as one word in a single write cycle.

In other words, for example, the error correction data forming circuit randomly takes 5 bits from the 8 bits of information data and generates a "1" if the number of "1"s indicated by the 5 bits is an odd number, whereas it generates a "0" if there are an even number of "1"s. By repeating this process four times, the error correction data forming circuit forms an error correction data of 4 bits.

Therefore, it possibly happens that when the test data pattern such as "0101 ... 0101" is applied to the semiconductor memory device, although "01010101" can be stored in an information data storing area of the memory cell array, the data stored in the error correction data storing area becomes "0110" for example. In other words, in spite of the fact that the 8-bit data of one word is composed of alternate bits, the remaining 4-bit data is not composed of alternate bits.

Therefore, information data must be inputted and stored in the error correction data storing area of the memory cell array, so that an alternate bit pattern can be obtained, in another write cycle different from the cycle in which information data are stored in the information data storing area.

Consequently, since two write cycles are required for one word test, in the case of the device of relatively low operation speed or of a large capacity (e.g., $E^2$ PROM), a relatively long test time is inevitably required.

In addition, since the data itself stored in the error correction data storing area will not be outputted to the outside and therefore cannot be confirmed, it is difficult to evaluate the performance even when abnormal operation is recognized.

SUMMARY OF THE INVENTION

With these problems in mind, therefore, the object of the present invention is to provide a semiconductor memory device provided with an error correcting function expedient for operation test and performance evaluation of the semiconductor device.

To achieve the above-mentioned object, the present invention provides a semiconductor memory device, comprising: a memory cell array formed by arranging memory cells composed of information data storing cells and error correction data storing memory cells; accepting means for accepting information data; error correction data forming means for forming error correction data related to the information data inputted from the accepting means; writing means for storing data to be written in the information data storing cells and data to be written in the error correction data storing cells at respective designated write addresses of the memory cell array; and written data selecting means, responsive to a write control signal, for selectively applying the error correction data and the information data to the writing means, as the data to be written in the error correction data storing cells.

Further, the present invention provides a semiconductor memory device, comprising: a memory cell array formed by arranging memory cells composed of information data storing memory cells and error correction data storing memory cells; output means for outputting read data to outside; reading means for reading data stored in the information data storing cells at designated read addresses of the memory cell array and data stored in the error correction data storing cells at the designated read addresses; error inspecting and correcting means for inspecting error of the data read from the information data storing cells on the basis of the data read from the error correction data storing cells, and correcting the data read from the information data storing cells if erroneous, thus outputting the data read from the information data storing cells as they are or the corrected data; and output data selecting means, responsive to an output control signal, for selectively applying the data output from the error inspecting and correcting means and the data read from the error correction data storing cells to the output means, as the read data.

DETAILED DESCRIPTION OF THE PREFERRED EMBODIMENTS

One embodiment of the present invention will be described hereinbelow with reference to the attached drawings.

Figure 1:
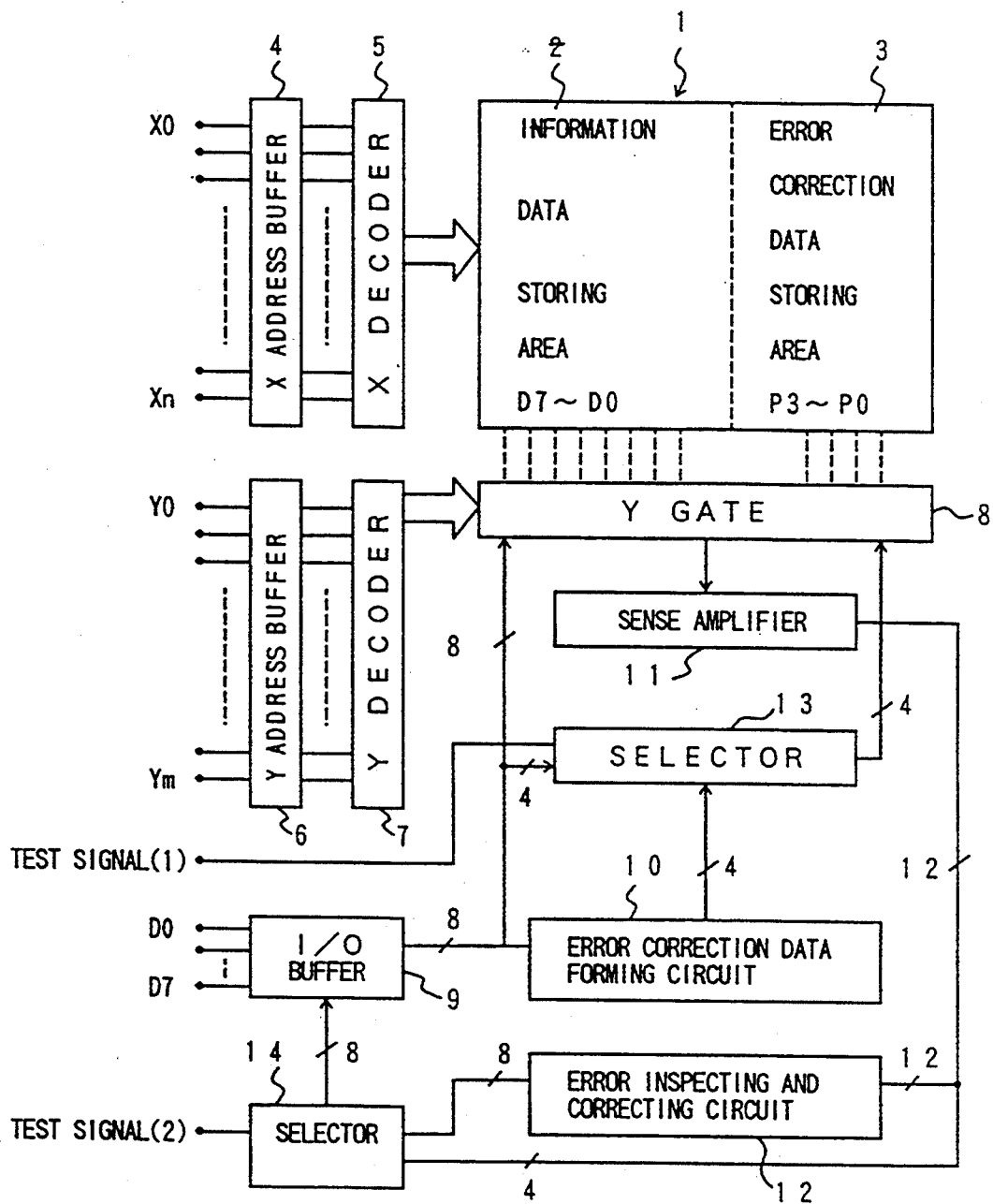
FIG. 1 is a block diagram showing a circuit configuration of one embodiment of the semiconductor memory device according to the present invention.

FIG. 1 shows the circuit configuration of the embodiment of the semiconductor memory device according to the present invention.

The semiconductor memory device shown in FIG. 1 is composed of a memory cell array 1, an X address buffer 4, an X decoder 5, a Y address buffer 6, a Y decoder 7, a Y gate 8, an input/output buffer 9, an error correction data forming circuit 10, a sense amplifier 11, and an error inspecting and correcting circuit 12. Further, the memory cell array 1 is formed by arranging memory cells with 12 bits (8-bit information data and 4-bit error correction data) as one word. Further, the memory cell array 1 includes an information data storing area 2 in which information data are stored and an error correction data storing area 3 in which the error correction data are stored.

The X address buffer 4 receives an external input signal indicative of X-direction (row) address data of a memory cell matrix of the memory cell array 1, in which $X_0$ to $X_n$ designate the respective bits of the input address data. The X decoder 5 decodes the inputted address data to designate the X-direction address of the memory cell array 1.

The Y address buffer 6 receives an external input signal indicative of Y-direction (column) address data of the memory cell matrix of the memory cell array 1, in which $Y_0$ to $Y_m$ designate the respective bits of the input address data. The Y decoder 7 decodes the inputted address data to designate the Y-direction address of the memory cell array 1. The address signal of the Y address decoder 7 is then supplied to the Y gate 8. On the basis of the designated Y-direction address, the Y gate 8 selects the memory cell corresponding to both the designated X- and Y-direction addresses to enable the selected memory cell to read data stored therein.

The input/output buffer 9 receives external information data. The received data are given to the Y gate 8 and the error correction data forming circuit 10, in which $D_0$ and $D_7$ designate the respective bits of the external information data. On the basis of the information data, the error correction data forming circuit 10 forms error correction data of 4 bits. The error correction data forming circuit 10 is composed of four bit forming circuits 10-0, 10-1, 10-2 and 10-3 as described later. The bit forming circuits 10-0 to 10-3 form an error correction data of 4 bits in the same way as described before.

The output of the error correction data forming circuit 10 is also supplied to the Y gate 8 together with the information data, and then stored in the memory cell array 1 through the Y gate 8 in addition to the information data.

The sense amplifier 11 reads data from the memory cell array 1 through the Y gate 8. The 12-bit output thereof is given to the error inspecting and correcting circuit 12. The error inspecting and correcting circuit 12 processes the received 12-bit data in accordance with a predetermined calculation to inspect whether error of the 8-bit information data is present or absent and further to find the error bit, if any. In the case of the absence of error, the received information data are outputted to the input/output buffer 9 as they are (as path-through data). In the case of the presence of an error bit, the error bit is inverted and then outputted to the input/output buffer 9.

In the embodiment shown in FIG. 1, the semiconductor memory device further comprises selector circuits 13 and 14.

The selector circuit 13 has a control signal input system and two 4-bit data input systems. A test signal (1) (write control signal) is inputted from an external circuit (not shown) to the control signal input system of the selector circuit 13. The output of the error correction data forming circuit 10 is inputted to one of the two data input systems of the selector circuit 13, and 4 higher significant bits $D_4$ to $D_7$ of the respective bits $D_0$ to $D_7$ of the information data received through the input/output buffer 9 are inputted to the other of the two data input system of the selector circuit 13.

Figure 2:
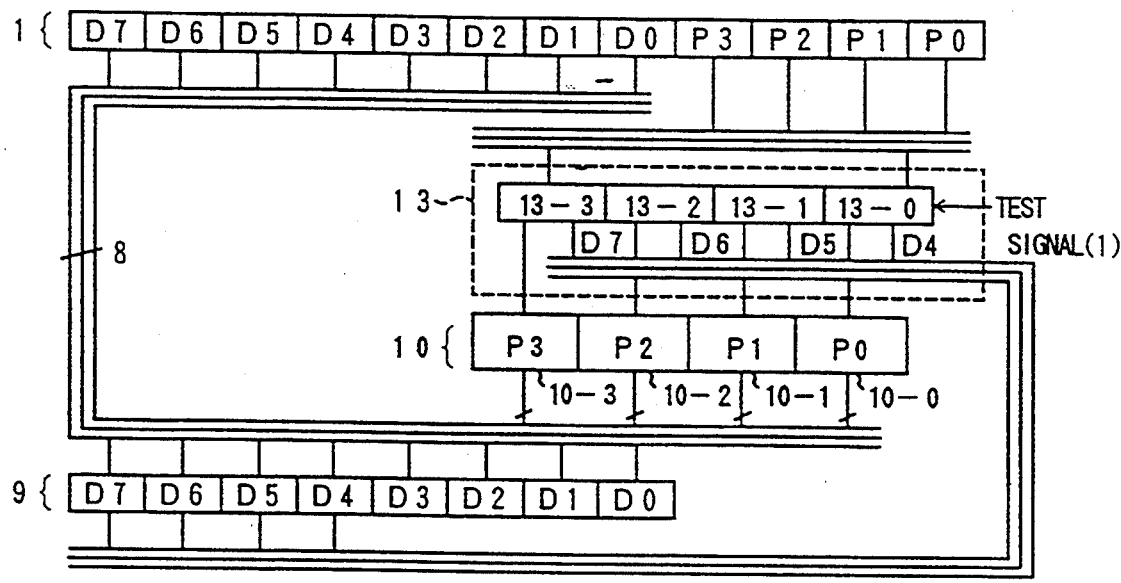
FIG. 2 is a conceptual block diagram showing the data flow in the write test circuit and the periphery thereof of the semiconductor memory device shown in FIG. 1.

The test signal (1) is a binary signal. The selector circuit 13 is provided with selectors 13-0 to 13-3, each for a bit, and selectively outputs any one of the data received by the two data input systems, as shown in FIG. 2, according to the level status of the test signal (1).

Figure 3:
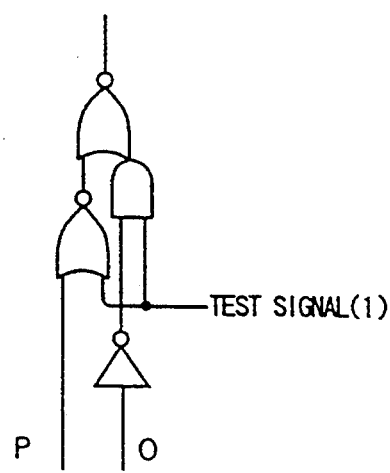
FIG. 3 is a circuit diagram showing the internal configuration of each bit selector circuit of the write test circuit of the semiconductor memory device shown in FIG. 1.

The outputs $P_0$ to $P_3$ of the respective bit forming circuits 10-0 to 10-3 are inputted to the respective selector circuits 13-0 to 13-3 in sequence beginning from the least significant bit $P_0$ of the error correction data. Further, the information data of 4 bits $D_4$ to $D_7$ are inputted to the respective selector circuits 13-0 to 13-3 in sequence beginning from the least significant bit $D_4$ of the four higher significant bits of the information data. Each of the respective selectors 13-0 to 13-3 has a logic circuit as shown in FIG. 3, which selectively outputs the information data $D_4$ to $D_7$, respectively in the test mode (test pattern writing mode) set when the test signal (1) is at logical "1", but outputs $P_0$ to $P_3$ of the error correction data forming circuits 10-0 to 10-3, respectively in the ordinary mode (data writing mode) set when the test signal (1) is at logical "0". Accordingly, when the test signal (1) is at logical "1" in the test mode, the 4 higher significant bits $D_4$ to $D_7$ of the information data are stored in the error correction data storing area 3 of the memory cell array 1.

On the other hand, the selector circuit 14 has one control signal input system, one 8-bit data input system, and one 4-bit data input system. A test signal (2) (output control signal) is inputted from an external circuit (not shown) to the control signal input system. The output of the error inspecting and correcting circuit 12 is inputted to the 8-bit data input system. The data in the error correction data storing area 3 of the memory cell array 1 are inputted to the 4-bit data input system through the sense amplifier 11.

The test signal (2) is also a binary signal. The selector circuit 14 is provided with a function for replacing the 4 higher significant bits of the data received by the 8-bit data input system with the data received by the 4-bit data input system according to the status level of the test signal (2).

Figure 4:
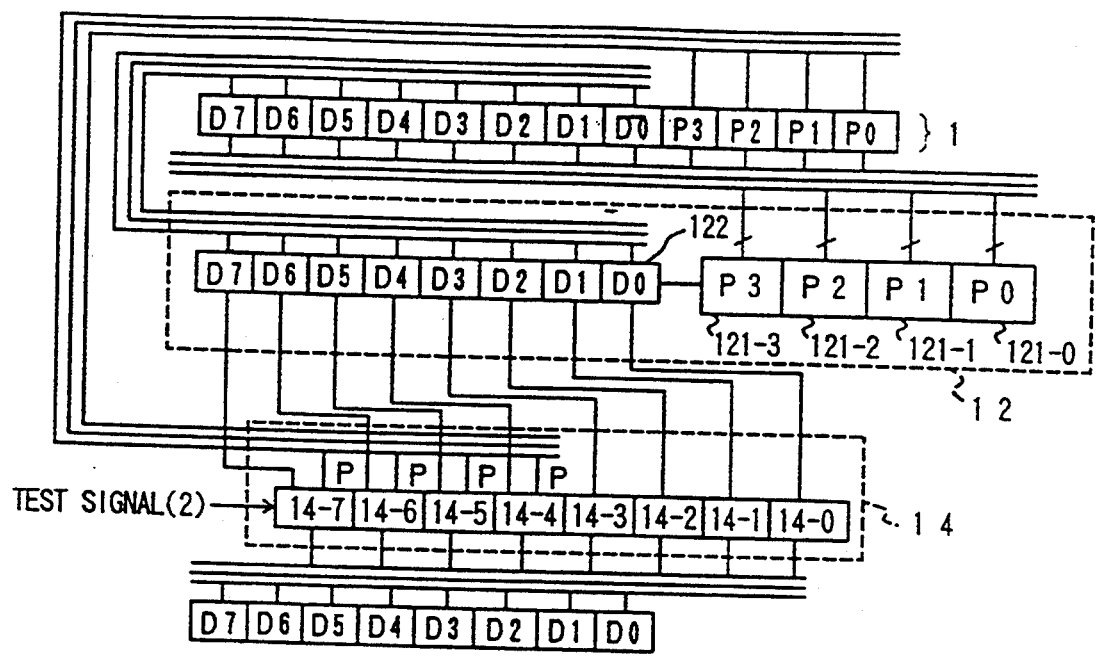
FIG. 4 is a conceptual block diagram showing the data flow in the read test circuit and the periphery thereof of the semiconductor memory device shown in FIG. 1.

FIG. 4 shows a circuit configuration related to the above-mentioned data replacement operation.

The error inspecting and correcting circuit 12 is provided with respective bit forming circuits 121-0 to 121-3 and a correction processing circuit 122 for the error inspection data. The respective bit forming circuits 121-0 to 121-3 receive determined 2-bit or more data of one word data stored in the memory cell array 1, respectively, and process the received data in accordance with a predetermined calculation to obtain each bit of 4-bit error inspection data, respectively.

The error inspection data is composed of bits each obtained as the calculation result of the respective bit forming circuits 121-0 to 121-3. In case of the presence of an error in the information data, the error bit is indicated. In case of the absence of an error in the information data, no bit is indicated. The result of the presence or absence of an error is supplied to the respective correction processing circuit 122. When the error inspection data indicates the absence of an error, the correction processing circuit 122 outputs the information data read from the memory cell array 1 as they are. When the error inspection data indicates a bit error, the correction processing circuit 122 outputs all the bits $D_0$ to $D_7$ after having inverted the corresponding error bit of the information data.

The selector circuit 14 is provided with respective selector circuits 14-0 to 14-3 and respective path-through circuits 14-4 to 14-7. The respective selector circuits 14-4 to 14-7 receive the 4 higher significant bits $D_4$ to $D_7$ of the 8-bit output of the correction processing circuit 122 and the 4-bits $P_0$ to $P_3$ read from the error correction data storing area 3 of the memory cell array 1, and outputs the error correction data bits $P_0$ to $P_3$ in the test mode set when the test signal (2) is at logical "1", and outputs the information data bits $D_4$ to $D_7$ in the ordinary mode set when the test signal (2) is at logical "0". The above-mentioned logic circuit can be realized by the similar circuit as shown in FIG. 3. The respective path-through circuits 14-0 to 14-3 receive the 4 lower significant bits $D_0$ to $D_3$ of the 8-bit output of the correction processing circuit 122, respectively; and outputs the same bits simultaneously when the respective selector circuits 14-4 to 14-7 output data, respectively. Therefore, when the test signal (2) is at logical "1" in the test mode, the 4 higher bits $D_4$ to $D_7$ of the information data are replaced with the bits $P_0$ to $P_3$ of the correction data of the memory cell array 1, and then outputted to the input/output buffer 9.

As described above, in the case where the semiconductor memory device according to the present invention is tested, first a write command (not shown) is inputted and the test signal (1) is set to the logical "1". Further, X- and Y-address data are inputted through the address buffers 4 and 6, respectively and additionally an 8-bit test pattern to be written in the memory cell array 1 is inputted through the input/output buffer 9.

Figure 5:
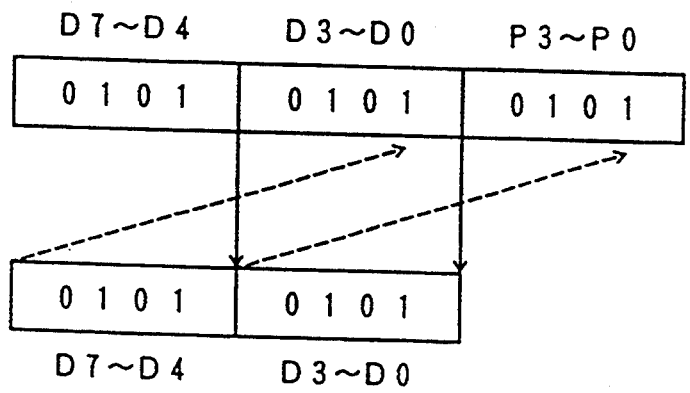
FIG. 5 is an illustration showing the relationship between data to be written in the information data storing cell and data to be written in the error correction data storing cell of the semiconductor memory device shown in FIG. 1.

In response to the test pattern, the selector circuit 13 outputs the 4 higher significant bits $D_4$ to $D_7$ of the information data obtained through the input/output buffer 9 (not the output of the error correction data forming circuit 10) to the error correction data storing area 3. Therefore, when a test pattern such as data "01010101" in the binary notation, as shown in FIG. 5, for instance is inputted through the input/output buffer 9, data "01010101" are stored in the information data storing area 2 of the memory cell array 1, and the 4 higher significant bits "0101" of the information data are stored in the error correction data storing area 3. In other words, it is possible to store the alternate pattern of "010101010101" of one word in a single write cycle.

Figure 6:
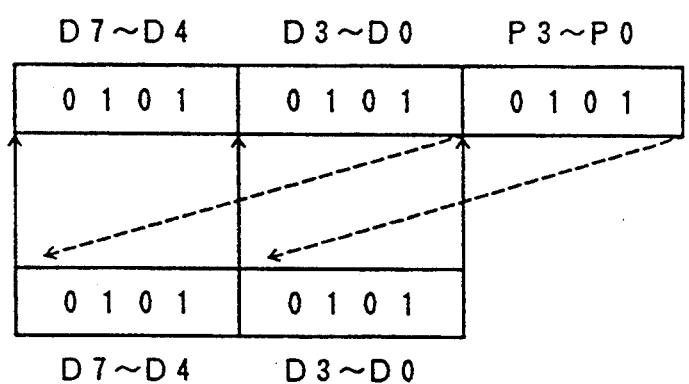
FIG. 6 is an illustration showing the relationship among data read from the information data storing cell, data read from the error correction data storing cell, and data read from the input/output buffer in the semiconductor memory device shown in FIG. 1.

In the case where the reading test is effected, first a read command (not shown) is inputted and the test signal (2) is set to the logical "1". Further, X- and Y-address data are inputted through the address buffers 4 and 6, respectively. In response to the test pattern, the selector circuit 14 outputs the output of the error inspection and correction circuit 12, after having replaced the 4 higher significant bits thereof with the 4 bits $P_0$ to $P_3$ in the error correction data storing area 3 (not the output of the error inspection and correction circuit 12). Therefore, when a pattern such as "010101010101" are read, data "01010101" obtained by replacing the $D_4$ to $D_7$ with $P_0$ to $P_3$ are outputted, as shown in FIG. 6. Accordingly, it is possible to read data stored in the error correction data storing area 3 of the memory cell array 1 on the basis of the 4 higher significant bits of the output of the input/output buffer 9.

As described above, in the memory device according to the present invention, it is possible to simplify the test system and further to facilitate the performance evaluation.

Further, according to the present invention, since a part of the information data are used as the test data to be stored in the error correction data storing area 3 during the write test, and further a part of bits of the input/output buffer 9 are used as the test data to be read during the read test, that is, since the test data can be input or output through the internal bus, it is unnecessary to increase the number of external terminal pads for inputting and outputting the test data.

Further, although the test signals (1) and (2) are inputted from the outside, the two test signals can be generated internally by processing the address data. In this case, it is unnecessary to increase the number of the pads for inputting the test signals.

Further, in the above-mentioned embodiment, although the memory cell array 1 is composed of 12 bits for one word, the present invention can be of course applied to the memory cell array composed of the number of bits more than or less than 12 bits.

Further, in the above-mentioned embodiment, although 4 higher significant bits of the information data have been used as the test bits during both the data writing and reading processing, it is of course possible to use 4 other (lower or intermediate) significant bits. Alternately, the test data can be inputted or outputted through other different routes.

As described above, in the semiconductor memory device according to the present invention, the device is set to the test mode in response to the write test signal. When a test pattern to be written in the memory cell array is inputted through the accepting means (an input-/output buffer), the written data selecting means (a selector circuit) outputs the data obtained through the accepting means, and not the output of the error correction data forming means (an error correction data forming circuit), to the error correction data storing cells. Therefore, it is possible to write any pattern not dependent upon the information data. Accordingly, any given pattern for one word can be written in a single write cycle, thus reducing the test time markedly.

Further, the device is set to the read test mode in response to the read test signal. The output data selecting means (a selector circuit) replaces a part of the output of the error inspecting and correcting means (an error inspecting and correcting circuit) with data stored in the error correction data storing cells and then outputs the replaced output (not the output of the error inspecting and correcting means as they are). Therefore, it is possible to read data stored in the error correction data storing cells of the memory cell array through the output means (an input/out buffer). Accordingly, the test system can be simplified and the performance evaluation can be facilitated.

In particular, in writing the test data, a part of the information data are used as the write test data to be stored in the error correction data storing cells. Further, in reading the test data, the test data can be inputted or outputted through the input and output buffer by use of internal data bus, so that it is unnecessary to increase the number of external terminal pads for inputting or outputting the test data.

What is claimed is:

1. A semiconductor memory device, comprising:
   a memory cell array formed by arranging memory cells composed of information data storing cells and error correction data storing memory cells;
   accepting means for accepting information data of a first amount;
   error correction data forming means for forming error correction data of a second amount less than the first amount and related to the information data inputted from the accepting means;
   writing means for storing data to be written in the information data storing cells and data to be written in the error correction data storing cells at respective designated write addresses of the memory cell array; and
   written data selecting means, responsive to a write control signal, for selectively applying the error correction data and a part of the information data to the writing means, as the data to be written in the error correction data storing cells, the amount of the part being equal to the second amount.

2. A device according to claim 1, wherein the written data selecting means comprises a first input system for accepting the error correction data and a second input system for accepting the information data, the written data selection means, responsive to the write control signal, selectively applying the data accepted by the first and second input systems to the writing means, as the data to be written in the error correction data storing cells.

3. A device according to claim 1, wherein the accepting means is an input buffer, and a part of the information data is supplied, via the input buffer, to the second input system.

4. A semiconductor memory device, comprising:
   a memory cell array formed by arranging memory cells composed of information data storing cells and error correction data storing memory cells;
   output means for outputting read data to outside;
   reading means for reading first data of a first amount stored in the information data storing cells at designated read addresses of the memory cell array and second data stored in the error correction data storing cells at the designated read addresses, error correction data of a second amount being less than the first amount and a part of the first data being selectively stored as the second data, the amount of the part being equal to the second amount;
   error inspecting and correcting means for inspecting error of the read first data on the basis of the read second data, and correcting the read first data if erroneous, thus outputting the read first data as is or the corrected data; and
   output data selecting means, responsive to an output control signal, for selectively applying the data output from the error inspecting and correcting means and the read second data to the output means, as the read data.

5. A device according to claim 4, wherein the output data selecting means comprises a first input system for accepting the data output from the error inspecting and correcting means and a second input system for accepting the data output from the error inspecting and correcting means, the output data selection means, responsive to the output control signal, selectively applying the data accepted by the first and second input systems to the output means, as the read data.

6. A device according to claim 5, wherein the output means is an output buffer, and a part of the data accepted by the second input system is outputted outside via the output buffer.

7. A semiconductor memory device, comprising:
   a memory cell array formed by arranging memory cells composed of information data storing cells and error correction data storing memory cells;
   accepting means for accepting information data of a first amount;
   error correction data forming means for forming error correction data of a second amount less than the first amount and related to the information data inputted from the accepting means;
   writing means for storing data to be written in the information data storing cells and data to be written in the error correction data storing cells at respective designated write addresses of the memory cell array;
   written data selecting means, responsive to a write control signal, for selectively applying the error correction data and a part of the information data to the writing means, as the data to be written in the error correction data storing cells, the amount of the part being equal to the second amount;
   output means for outputting read data to outside;

reading means for reading data stored in the information data storing cells at the addresses of the memory cell array and data stored in the error correction data storing cells at the addresses;

error inspecting and correcting means for inspecting error of the data read from the information data storing cells on the basis of the data read from the error correction data storing cells, and correcting the data read from the information data storing cells if erroneous, thus outputting the data read from the information data storing cells as is or the corrected data; and output data selecting mens, responsive to an output control signal, for selectively applying the data output from the error inspecting and correcting means and the data read from the error correction data storing cells to the output means, as the read data.

8. A method of writing data in a semiconductor memory device comprising a memory cell array formed by arranging memory cells composed of information data storing cells and error correction data storing memory cells, the method comprising the steps of:

inputting information data of a first amount in the semiconductor memory device;

forming error correction data of a second amount less than the first amount and related to the information data;

selecting data to be written in the error correction data storing memory cells from a part of the information data and error correction data in response to a write control signal, the amount of the part being equal to the second amount; and storing the information data and the selected data in the information data storing cells and the error correction data storing cells, respectively at respective designated write addresses of the memory cell array.

9. A method of outputting data from a semiconductor memory device comprising a memory cell array formed by arranging memory cells composed of information data storing cells and error correction data storing memory cells, the method comprising the steps of:

reading first data of a first amount stored in the information data storing cells at designated read addresses of the memory cell array and second data stored in the error correction data storing cells at the designated read addresses, error correction data of a second amount being less than the first amount and a part of the first data being selectively stored as the second data, the amount of the part being equal to the second amount;

inspecting error of the read first data on the basis of the read second data, and correcting the read first data if erroneous, thus outputting the read first data as is or the corrected data; and selectively outputting the data output from the error inspecting and correcting means and the read second data in response to an output control signal.

10. A method of writing data in and outputting the data from a semiconductor memory device comprising a memory cell array formed by arranging memory cells composed of information data storing cells and error correction data storing memory cells, the method comprising the steps of:

inputting information data of a first amount in the semiconductor memory device;

forming error correction data of a second amount less than the first amount and related to the information data;

selecting data to be written in the error correction data storing memory cells from a part of the information data and error correction data in response to a write control signal, the amount of the part being equal to the second amount;

storing the information data and the selected data in the information data storing cells and the error correction data storing cells, respectively at respective designated write addresses of the memory cell array;

reading the data stored in the information data storing cells at the addresses of the memory cell array and the data stored in the error correction data storing cells at the addresses;

inspecting error of the data read from the information data storing cells on the basis of the data read from the error correction data storing cells, and correcting the data read from the information data storing cells if erroneous, thus outputting the data read from the information data storing cells as is or the corrected data; and selectively outputting the data output from the error inspecting and correcting means and the data read from the error correction data storing cells in response to an output control signal.

* * * * *